US008860089B2

(12) United States Patent
Park et al.

(10) Patent No.: US 8,860,089 B2
(45) Date of Patent: Oct. 14, 2014

(54) HIGH ELECTRON MOBILITY TRANSISTOR AND METHOD OF MANUFACTURING THE SAME

(71) Applicant: Samsung Electronics Co., Ltd., Suwon-Si (KR)

(72) Inventors: Ki-yeol Park, Suwon-si (KR); Woo-chul Jeon, Daegu (KR); Young-hwan Park, Seoul (KR); Jai-kwang Shin, Anyang-si (KR); Jong-bong Ha, Yongin-si (KR); Sun-kyu Hwang, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/754,047

(22) Filed: Jan. 30, 2013

(65) Prior Publication Data

US 2014/0061725 A1  Mar. 6, 2014

(30) Foreign Application Priority Data

Sep. 4, 2012  (KR) ........................ 10-2012-0097864

(51) Int. Cl.
*H01L 29/778*  (2006.01)
*H01L 29/66*  (2006.01)
*H01L 29/10*  (2006.01)
*H01L 29/423*  (2006.01)
*H01L 29/20*  (2006.01)

(52) U.S. Cl.
CPC .......... *H01L 29/778* (2013.01); *H01L 29/7787* (2013.01); *H01L 29/2003* (2013.01); *H01L 29/66431* (2013.01); *H01L 29/66462* (2013.01); *H01L 29/1033* (2013.01); *H01L 29/42316* (2013.01)
USPC ....................................................... 257/194

(58) Field of Classification Search
USPC .......... 438/257; 257/192, 194, E21.403, 195, 257/196
See application file for complete search history.

(56) References Cited

U.S. PATENT DOCUMENTS

| 5,072,961 A | 12/1991 | Huppe |
| 5,285,087 A * | 2/1994 | Narita et al. ................... 257/192 |
| 5,350,709 A * | 9/1994 | Harada et al. ................. 438/181 |
| 8,072,002 B2 | 12/2011 | Niyama et al. |
| 2009/0242938 A1 | 10/2009 | Niijama et al. |
| 2010/0320557 A1 | 12/2010 | Miyoshi et al. |
| 2011/0187280 A1 | 8/2011 | Chung |
| 2011/0279060 A1 | 11/2011 | Wang |

FOREIGN PATENT DOCUMENTS

| JP | 2009-170864 A | 7/2009 |
| JP | 2010-205760 A | 9/2010 |
| JP | 4818489 B1 | 11/2011 |
| KR | 1997-0054363 A | 7/1997 |
| KR | 10-0353487 B1 | 7/2001 |
| KR | 2006-0044534 A | 5/2006 |

* cited by examiner

Primary Examiner — Nathan Ha
(74) Attorney, Agent, or Firm — Harness, Dickey & Pierce, P.L.C.

(57) ABSTRACT

According to example embodiments, a higher electron mobility transistor (HEMT) may include a first channel layer, a second channel layer on the first channel layer, a channel supply on the second channel layer, a drain electrode spaced apart from the first channel layer, a source electrode contacting the first channel layer and contacting at least one of the second channel layer and the channel supply layer, and a gate electrode unit between the source electrode and the drain electrode. The gate electrode unit may have a normally-off structure. The first and second channel layer form a PN junction with each other. The drain electrode contacts at least one of the second channel layer and the channel supply layer.

21 Claims, 9 Drawing Sheets

HIGH ELECTRON MOBILITY TRANSISTOR AND METHOD OF MANUFACTURING THE SAME

CROSS-REFERENCE TO RELATED APPLICATIONS

This application claims priority under 35 U.S.C. §119 to Korean Patent Application No. 10-2012-0097864, filed on Sep. 4, 2012, in the Korean Intellectual Property Office, the disclosure of which is incorporated herein in its entirety by reference.

BACKGROUND

1. Field

Example embodiments relate to power sources, and/or more particularly, to high electron mobility transistors and methods of manufacturing the same.

2. Description of the Related Art

In a power conversion system, an efficiency of the entire system may depend upon an efficiency of a power switching device. As a switching device, a power metal oxide semiconductor field effect transistor (MOSFET) or an insulated gate bipolar transistor (IGBT) using silicon has been mainly used. However, increasing an efficiency of a switching device may be limited due to material limitations of silicon.

To overcome the limitation of the silicon material, research into a high electron mobility transistor (HEMT) is being actively conducted.

A HEMT may include semiconductor layers having different electrical polarization characteristics. A semiconductor layer having a relatively large polarizability in the HEMT may cause a two-dimensional electron gas (2DEG) in other semiconductor layers that are hetero-bonded with the semiconductor layer. The 2DEG may be used as a channel between a drain electrode and a source electrode, and an electric current flowing in the channel may be controlled according to a bias voltage applied to a gate electrode.

Meanwhile, the HEMT may include a fast recovery diode (FRD) for freewheeling current of the HEMT and stabilizing a voltage change rate in order to limit an avalanche breakdown. An avalanche breakdown may occur when a HEMT is turned off. A FRD may be connected to the HEMT in parallel.

However, as described above, if the FRD is connected to the HEMT as an additional device, an additional process for fabricating the FRD may be necessary, and accordingly, a size of the HEMT may increase, and fabrication costs also may increase.

SUMMARY

Example embodiments relate to single high electron mobility transistors (HEMTs) functioning as field effect semiconductor devices and fast recovery diodes (FRDs).

Example embodiments also relate to methods of manufacturing HEMTs.

Additional aspects will be set forth in part in the description that follows and, in part, will be apparent from the description, or may be learned by the practice of example embodiments.

According to example embodiments, a high electron mobility transistor includes: a first channel layer; a second channel layer on the first channel layer, the second channel layer forming a PN junction with the first channel layer; a channel supply layer on the second channel layer; a drain electrode spaced apart from the first channel layer, the drain electrode contacting at least one of the second channel layer and the channel supply layer; a source electrode contacting the first channel layer and contacting at least one of the second channel layer and the channel supply layer; and a gate electrode unit between the source electrode and the drain electrode. The gate electrode may have a normally-off structure.

In example embodiments, the first channel layer may be a p-type semiconductor layer, and the second channel layer may be an n-type semiconductor layer.

In example embodiments, the first channel layer may be a p-type doped GaN layer, and the second channel layer may be one of an undoped GaN layer and an n-type doped GaN layer.

In example embodiments, at least one of the channel supply layer and the second channel layer may define a source electrode accommodation portion, and the source electrode may be formed in the source electrode accommodation portion.

In example embodiments, the source electrode accommodation portion may be recessed towards the first channel layer.

In example embodiments, the source electrode accommodation portion may extend to one of: an interface between the first channel layer and the second channel layer, and a deeper depth than the interface between the first channel layer and the second channel layer.

In example embodiments, the source electrode may include: a first area of the source electrode that may be in ohmic contact with the first channel layer; and a second area of the source electrode that may be in ohmic contact with at least one of the second channel layer and the channel supply layer.

In example embodiments, the first area of the source electrode may be in p-type ohmic contact with the first channel layer, and the second area of the source electrode may be in n-type ohmic contact with at least one of the second channel layer and the channel supply layer.

In example embodiments, a bandgap of the channel supply layer may be greater than a bandgap of the second channel layer.

In example embodiments, the gate electrode unit may include: a gate electrode between the source electrode and the drain electrode; and a gate electrode accommodation portion defined by the channel supply layer and the second channel layer. The gate electrode may be in the gate electrode accommodation portion.

In example embodiments, the gate electrode accommodation portion may be recessed towards the first channel layer. The high electron mobility transistor may further include an insulating layer between the gate electrode and the gate electrode accommodation portion.

In example embodiments, the gate electrode unit may include: a gate electrode formed between the source electrode and the drain electrode; and a channel depletion layer between the gate electrode and the channel supply layer. The channel depletion layer may be a p-type semiconductor layer.

According to example embodiments, a method of manufacturing a high electron mobility transistor includes: forming a first channel layer; forming a second channel layer on the first channel layer, the first channel layer and the second channel layer forming a PN junction with each other; forming a channel supply layer on the second channel layer; forming a source electrode accommodation portion defined by the second channel layer and the channel supply layer so the source electrode accommodation portion exposes a part of the first channel layer; forming a source electrode in the source electrode accommodation portion, the source electrode contacting the first channel layer; forming a drain electrode that is spaced apart from the first channel layer and contacts at least one of the second channel layer and the channel supply layer; and forming a gate electrode unit between the source electrode and the drain electrode and having a normally-off structure.

In example embodiments, the forming of the source electrode accommodation portion may include forming the source electrode accommodation portion to one of: an interface between the first channel layer and the second channel layer, and a deeper depth than the interface between the first channel layer and the second channel layer.

In example embodiments, the forming the source electrode may include: forming a first area of the source electrode that is in ohmic contact with the first channel layer; and forming a second area of the source electrode that is in ohmic contact with at least one of the second channel layer and the channel supply layer.

In example embodiments, the forming of the gate electrode unit may include: forming a gate electrode accommodation portion as a recess defined by the channel supply layer and the second channel layer that is between the source electrode and the drain electrode; and forming a gate electrode in the gate electrode accommodation portion.

In example embodiments, the method may further include: forming an insulating layer on the gate electrode accommodation portion before the forming the gate electrode.

In example embodiments, the forming the gate electrode unit may include: forming a channel depletion layer between the source electrode and the drain electrode; and forming the gate electrode on the channel depletion layer.

BRIEF DESCRIPTION OF THE DRAWINGS

These and/or other aspects will become apparent and more readily appreciated from the following description of non-limiting embodiments, taken in conjunction with the accompanying drawings in which.

DETAILED DESCRIPTION

Figure 1:
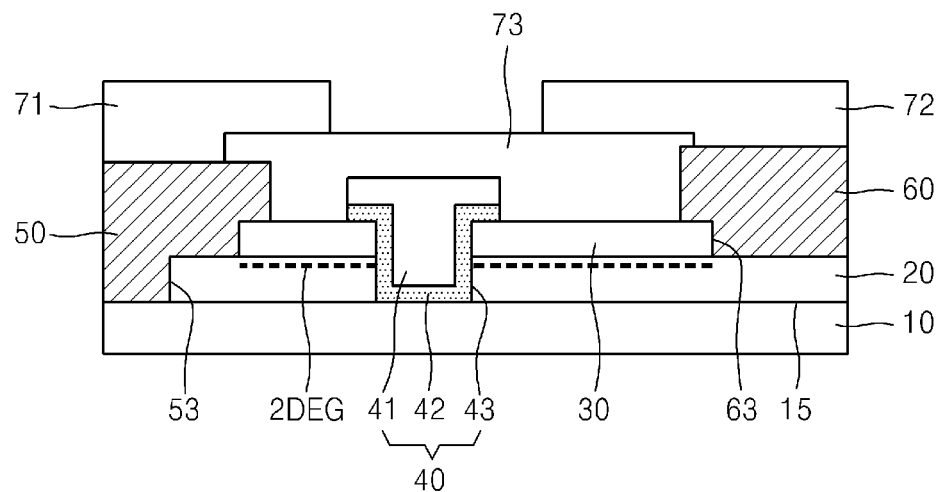
FIG. 1 is a schematic cross-sectional view of a high electron mobility transistor (HEMT) according to example embodiments.

Reference will now be made in detail to the accompanying drawings, in which some example embodiments are shown. Example embodiments may have different forms and should not be construed as being limited to the descriptions set forth herein; rather, these example embodiments are provided so that this disclosure will be thorough and complete, and will fully convey the scope of example embodiments to those of ordinary skill in the art. In the drawings, the widths and thicknesses of layers and regions may be exaggerated for clarity. Like reference numerals denote like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a high electron mobility transistor (HEMT) according to example embodiments and a method of manufacturing a HEMT according to example embodiments will be described with reference to the accompanying drawings.

FIG. 1 is a schematic cross-sectional view of a high electron mobility transistor (HEMT) according to example embodiments.

Referring to FIG. 1, an HEMT according to example embodiments may include a first channel layer 10, a second channel layer 20, a channel supply layer 30, a gate electrode unit 40, a source electrode 50, and a drain electrode 60.

The first channel layer 10 may be a p-type semiconductor layer. For example, the first channel layer 10 may be a p-type doped GaN layer. In this regard, a material of the first channel layer 10 is not limited to GaN, and may include at least one selected from the group consisting of InGaN, AlGaN, AlInGaN, etc. Although magnesium (Mg) may be used as a p-type doped material, example embodiments are not limited thereto.

The second channel layer 20 may be disposed on the first channel layer 10. The second channel layer 20 may form a PN junction with the first channel layer 10. To this end, the second channel layer 20 may be an n-type semiconductor layer. The second channel layer 20 may be a semiconductor layer doped with an n-type doping material. However, example embodiments are not limited thereto. The second channel layer 20 may be an undoped semiconductor layer. For example, the second channel layer 20 may be an undoped GaN layer or an n-type doped GaN layer. The undoped GaN layer may exhibit a characteristic of the n-type semiconductor according to a characteristic of a GaN layer although the GaN layer is undoped. In this regard, a material of the second channel layer 20 is not limited to GaN, and may include at least one selected from the group consisting of InGaN, AlGaN, AlInGaN, etc. Silicon (Si) may be used as the n-type doping material. However, the n-type doping material is not limited thereto.

A PN junction may be formed between the first channel layer 10 and the second channel layer 20, and thus a current direction may be limited to a direction from the first channel layer 10 to the second channel layer 20. In other words, a rectifying action in which current flows from the first channel layer 10 to the second channel layer 20 but current does not flow from the second channel layer 20 to the first channel layer 10 may take place.

The channel supply layer 30 may be disposed on the second channel layer 20. The channel supply layer 30 may include a material (e.g., a semiconductor), of which at least one of a polarization characteristic, an energy bandgap, and a lattice constant is different from that of the second channel layer 20. For example, the channel supply layer 30 may include a material (e.g., a semiconductor) having a polarizability and/or an energy bandgap that are/is greater than those of the second channel layer 20. For example, the channel supply layer 30 may have a single- or multi-layered structure including one or more selected from nitride materials including at least one of Al, Ga, In, and B. In particular, the channel supply layer 30 may have a single- or multi-layered structure including at least one selected from the group consisting of AlGaN, AlInN, InGaN, AlN, AlInGaN, and the like. The channel supply layer 30 may be undoped. In some cases, however, the channel supply layer 30 may be an n-type semiconductor layer doped with desired (and/or alternatively predetermined) impurities.

A two-dimensional electron gas (2DEG) may be formed in at least a part of the second channel layer 20. The 2DEG may be formed in a region of the second channel layer 20 under an interface 15 between the second channel layer 20 and the channel supply layer 30. The 2DEG formed in the second channel layer 20 may be used as a current path, e.g., a channel, between the source electrode 50 and the drain electrode 60. The 2DEG is formed in the second channel layer 20, thereby limiting (and/or preventing) electrons from moving in the first channel layer 1. This limits (and/or prevents) the electrons from being scattered by impurities, e.g., the p-type doping material, in the first channel layer 10 that is the p-type semiconductor layer, and thus an on-resistance may be reduced. In this regard, the on-resistance means the magnitude of resistance between the drain electrode 60 and the source electrode 50 during an application of a desired (and/or alternatively predetermined) gate voltage to a gate electrode 41 of the HEMT.

The gate electrode 41 may control a current flowing between the source electrode 60 and the drain electrode 60. The source electrode 50 and the drain electrode 60 may be spaced apart from each other, and the gate electrode 41 may be disposed between the source electrode 60 and the drain electrode 60. The gate electrode 41 may be located closer to the source electrode 50 than to the drain electrode 60. That is, a distance between the source electrode 50 and the gate electrode 41 may be shorter than a distance between the drain electrode 60 and the gate electrode 41. However, example embodiments are not limited thereto, and relative distances between the source electrode 50/the drain electrode 60 and the gate electrode 41 may vary.

A gate electrode unit 40 including the gate electrode 41 may have a normally-off structure. The normally-off structure is a structure that is in a turned-off state when a voltage is not applied to the gate electrode 41, that is, in a normal state, and in a turned-on state when a voltage is applied to the gate electrode 41.

As an example of the normally-off structure, the gate electrode unit 40 may further include a gate electrode accommodation portion 43 that accommodates the gate electrode 41 therein. In this regard, the gate electrode accommodation portion 43 may be formed as a recess in the channel supply layer 30 towards the first channel layer 10. The gate electrode accommodation portion 43 may be formed by etching the channel supply layer 30 and the second channel layer 20.

The gate electrode 41 is accommodated in the gate electrode accommodation portion 43, and thus the 2DEG may not be formed in the region corresponding to the gate electrode 41, or the region corresponding to the gate electrode 41 may have a characteristic (electron concentration, etc.) different from those of other regions. Accordingly, when a voltage is not applied to the gate electrode 41 accommodated in the gate electrode accommodation portion 43, the 2DEG is not formed under the gate electrode 41 as shown in FIG. 1, and thus, the gate electrode 41 (and/or HEMT) may be in the turned-off state. An insulating layer 42 may be disposed between the gate electrode accommodation portion 43 and the gate electrode 41. The insulating layer 42 may be formed along at least a part of an upper portion of the channel supply layer 30 and an inner surface of the gate electrode accommodation portion 43. The insulating layer 42 may include, for example, at least one selected from the group consisting of $Al_2O_3$, $SiO_x$, $Si_xN_y$, $Sc_2O_3$, AlN, $Ga_2O_3$, $Gd_2O_3$, $Al_xGa_2(1-x)O_3$, MgO, and a combination thereof. Otherwise, an insulating material generally used in a transistor may be used to form the insulating layer 42.

Figure 2:
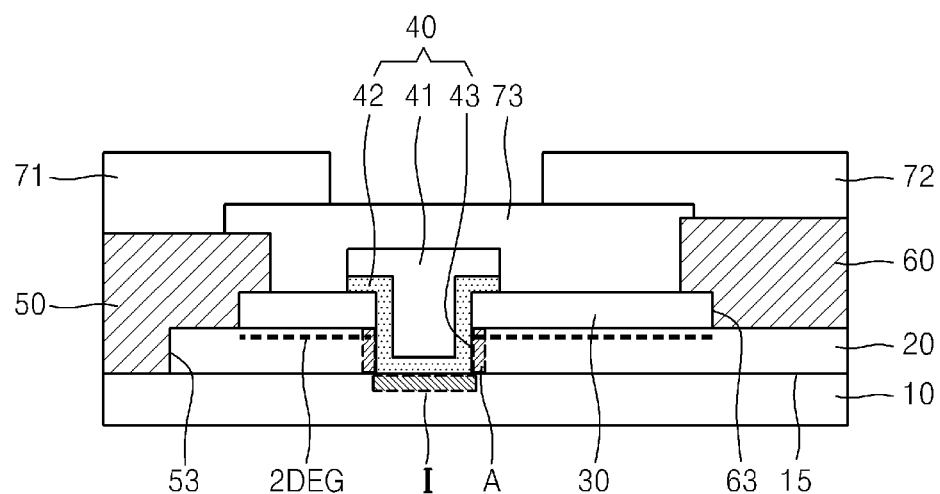
FIG. 2 is a schematic cross-sectional view of the HEMT of FIG. 1 when a desired (and/or alternatively predetermined) voltage is applied to a gate electrode.

A shape and depth of the gate electrode accommodation portion 43 may vary. For example, the gate electrode accommodation portion 43 may be formed to the interface 15 between the first channel layer 10 and the second channel layer 20 as shown in FIG. 1. The 2DEG formed by the second channel layer 20 is separated by the gate electrode accommodation portion 43. Accordingly, a HEMT according to example embodiments may secure a turned-off state in the normal state. In a case where a desired (and/or alternatively predetermined) voltage higher than a threshold voltage Vth is applied to the gate electrode 41, an accumulation area A and an inversion area I is formed between the separated 2DEG as shown in FIG. 2, thus the gate electrode 41 may be in an turned-on state. The accumulation area A is an area in which electrons approach to the gate electrode 41 and are accumulated in the second channel layer 20. The inversion area I is an area in which electrons approach to the gate electrode 41 and are inverted in the first channel layer 10. However, the accumulation area A and the inversion area I may be different according to the depth of the gate electrode accommodation portion 43. For example, in a case where the gate electrode accommodation portion 43 is formed to a lower depth than the interface 15 between the first channel layer 10 and the second channel layer 20, the accumulation area A is formed between the separated 2DEG, and thus the gate electrode 41 may be in the turned-on state.

Figure 3:
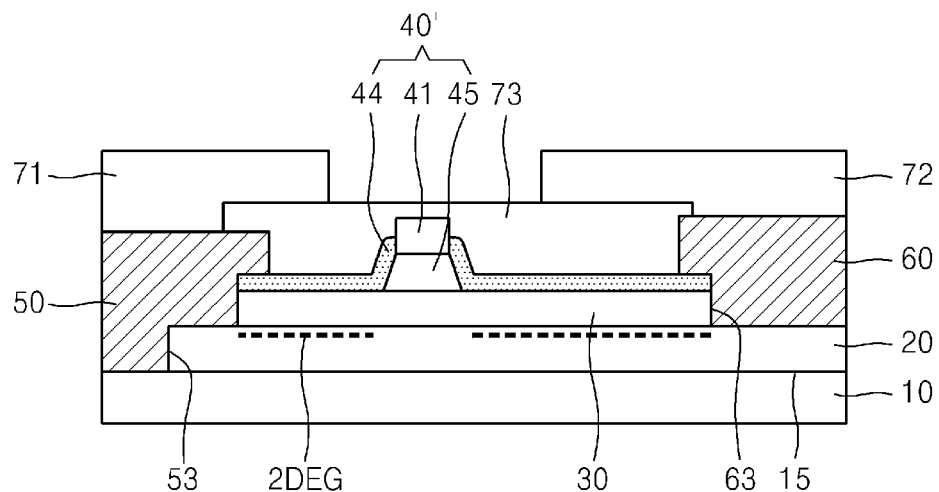
FIG. 3 is a schematic cross-sectional view of a HEMT according to example embodiments.

As another example of the normally-off structure, a gate electrode layer portion 40' may include a channel depletion layer 45 between the gate electrode 41 and the channel supply layer 30 as shown in FIG. 3. A 2DEG below the channel depletion layer 45 may be depleted by the channel depletion layer 45. Accordingly, a HEMT according to example embodiments may maintain the turned-off state in the normal state. An insulating layer 44 may be disposed on the channel supply layer 30. The channel depletion layer 45 may include the p-type conductor or a dielectric substance. Also, the channel depletion layer 45 may be a nitride layer including at least one of Al, In, and Ga and may be doped with the p-type doping material. The nitride layer may be formed of GaN, InN, AlGaN, AlInN, InGaN, or AlInGaN.

However, the gate electrode unit 40 having the normally-off structure is not limited to the above example. The gate electrode unit 40 may include various structures for a normally-off HEMT. For example, although not shown in the drawings, the gate electrode unit 40 may have a structure having an oxidized area between the gate electrode 41 and the channel supply layer 30. The oxidized area may be an area processed with oxygen plasma. An insulating layer may be disposed between the oxidized area and the gate electrode 41.

Referring to FIGS. 1 and 2 again, the source electrode 50 may contact the first channel layer 10, and the drain electrode 60 may be spaced apart from the first channel layer 10 and contact the second channel layer 20 or the channel supply layer 30.

In a case where a forward voltage is applied to the source electrode 50 and the drain electrode 60, that is, in a case where a positive (+) voltage is applied to the drain electrode 60, and a negative (−) voltage or a ground voltage (0 V) is applied to the source electrode 50, electrons move from the source electrode 50 to the drain electrode 60 via the 2DEG and the accumulation area A formed in the second channel layer 20 and the inversion area I formed in the first channel layer 10. In the remaining area of the first channel layer 10 except for the inversion area I, electrons may be restricted to move from the first channel layer 10 to the second channel layer 20 by the PN junction. In this case, a current flows from the drain electrode 60 to the source electrode 50.

In a case where a backward voltage is applied to the source electrode 50 and the drain electrode 60, that is, in a case where a higher voltage is applied to the source electrode 50 than the drain electrode 60, electrons may move from the drain electrode 60 to the source electrode 50 through the interface 15 between the first channel layer 10 and the second channel layer 20 by which the PN junction is formed. At this time, in a case where the negative (−) voltage or the ground voltage (0 V) is applied to the gate electrode 41, electrons are blocked (and/or limited) to move through the second channel layer 20. Accordingly, a backward current that occurs when the gate electrode 41 is turned off may flow from the source electrode 50 to the drain electrode 60.

A HEMT according to example embodiments may implement a function of a fast recovery diode (FRD) through the above-described source electrode 50 and drain electrode 60 without externally installing an additional diode.

A HEMT according to example embodiments may include a source electrode accommodation portion 53 that accommodates the source electrode 50 therein, as a specific example of contacting the source electrode 50 and the first channel layer 10.

The source electrode accommodation portion 53 may be formed as a recess towards the first channel layer 10. The source electrode accommodation portion 53 may be formed over the channel supply layer 30 and the first channel layer 10. The source electrode accommodation portion 53 may be formed having a step with respect to the second channel layer 20, the first channel layer 10, and the channel supply layer 30 as shown in FIGS. 1 and 2. However, the shape of the source electrode accommodation portion 53 is not limited to the above example. The source electrode accommodation portion 53 may be formed having the same width and no step with respect to the first channel layer 10 and the channel supply layer 30.

Figure 4:
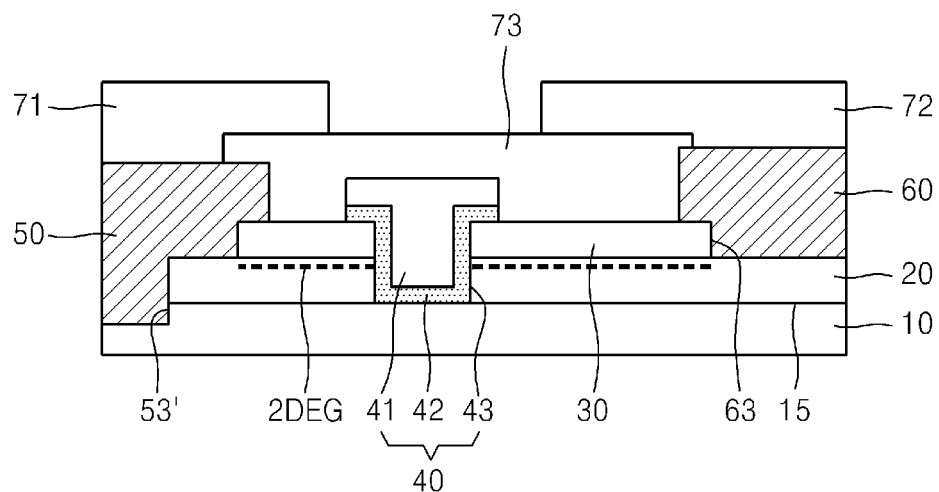
FIG. 4 is a schematic cross-sectional view of a HEMT according to example embodiments.

The source electrode accommodation portion 53 may have a depth in such a manner that the source electrode 50 may contact the first channel layer 10. For example, the source electrode accommodation portion 53 may be formed until the interface 15 between the first channel layer 10 and the second channel layer 20. As another example, a source electrode accommodation portion 53' as shown in FIG. 4 may be formed to have a deeper depth than the interface 15 between the first channel layer 10 and the second channel layer 20. To this end, the source electrode accommodation portion 53' may be formed over parts of the channel supply layer 30, the second channel layer 20, and the first channel layer 10.

A HEMT according to example embodiments may include a drain electrode accommodation portion 63 that accommodates the drain electrode 60 therein as a specific example of spacing the drain electrode 60 from the first channel layer 10. The drain electrode accommodation portion 63 may be formed by etching the channel supply layer 30. However, the drain electrode accommodation portion 63 is not an indispensable element and may be not formed if necessary. In a case where the drain electrode accommodation portion 63 is not formed, the drain electrode 60 may be disposed on the channel supply layer 30.

Meanwhile, referring to FIG. 1 again, a first pad 71 may be disposed on the source electrode 50, and a second pad 72 may be disposed on the drain electrode 60. A passivation layer 73 may be disposed between the first pad 71 and the second pad 72. The passivation layer 73 may protect the gate electrode 41, and at the same time, limit (and/or prevent) the gate electrode 41 from electrically contacting the source electrode 50, the first pad 71, and the second pad 72.

Figure 5:
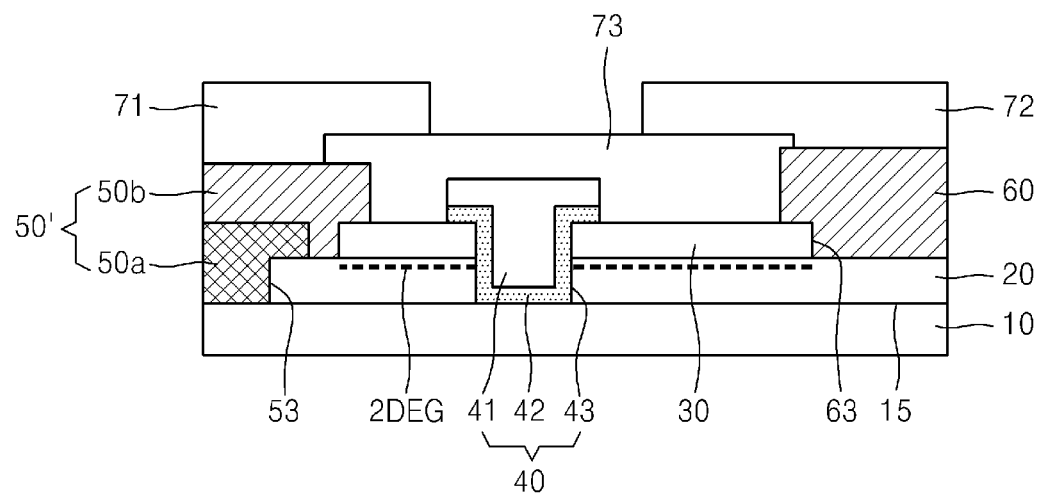
FIG. 5 is a schematic cross-sectional view of a HEMT according to example embodiments.

FIG. 5 is a schematic cross-sectional view of a HEMT according to example embodiments. In FIG. 5, the source electrode 50' is different than the source electrode 50 in the HEMT of FIG. 1. Referring to FIG. 5, the source electrode 50' may include a first area 50a in ohmic contact with the first channel layer 10 and a second area 50b in ohmic contact with at least one of the second channel layer 20 and the channel supply layer 30. The second area 50b, for example, may be in ohmic contact with both the second channel layer 20 and the channel supply layer 30.

The first channel layer 10 is a p-type semiconductor layer. The first area 50a of the source electrode 50' may be in p-type ohmic contact with the first channel layer 10. The second channel layer 20 is an n-type semiconductor layer. The second area 50b of the source electrode 50' may be in n-type ohmic contact with the second channel layer 20. Also, the channel supply layer 30 may be the n-type semiconductor layer. The second area 50b of the source electrode 50' may be in n-type ohmic contact with the channel supply layer 30. However, the first area 50a and the second area 50b of the source electrode 50' are not necessarily formed of different materials. The area 50a and the second area 50b may be formed of the same material capable of forming p-type ohmic contact and n-type ohmic contact.

Figure 6:
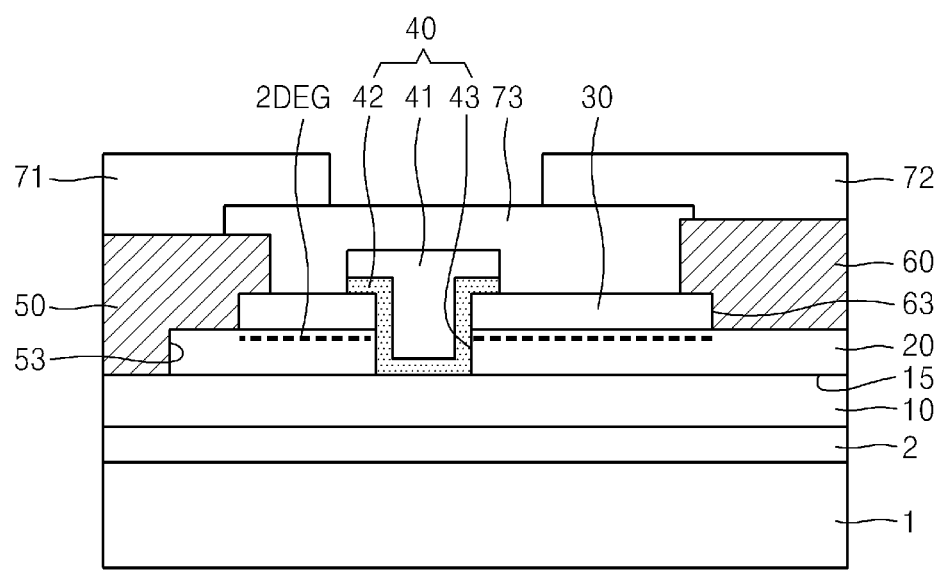
FIG. 6 is a schematic cross-sectional view of a HEMT according to example embodiments further including a substrate and a buffer layer compared to the HEMT of FIG. 1.

FIG. 6 is a schematic cross-sectional view of a HEMT according to example embodiments that further includes a substrate 1 and a buffer layer 2 compared to the HEMT of FIG. 1. Referring to FIG. 6, the buffer layer 2 may be disposed on the substrate 1. The substrate 1 may be formed of, for example, sapphire, Si, SiC, or GaN. The buffer layer 2 may reduce differences between lattice constants and thermal expansion coefficients of the substrate 1 and the first channel layer 10, thereby limiting (and/or preventing) the deterioration of crystallinity of the first channel layer 10. The buffer layer 2 may have a single- or multi-layered structure including at least one material selected from nitride materials including at least one of Al, Ga, In, and B. In particular, the buffer layer 2 may have a single- or multi-layered structure including at least one selected from the group consisting of AlN, GaN, ALGaN, InGaN, AlInN, and AlGaInN. In some cases, a desired (and/or alternatively predetermined) seed layer (not shown) may be further disposed between the substrate 1 and the buffer layer 2. The seed layer may be a base layer for growing the buffer layer 2. The substrate 1 and the buffer layer 2 may be removed after manufacturing the HEMT. That is, the substrate 1 and the buffer layer 2 may be selectively included in the HEMT.

FIGS. 7A through 7G are cross-sectional views of a method of manufacturing the HEMT of FIG. 1, according to example embodiments.

Figure 7A:
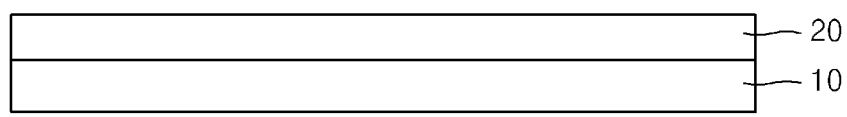
FIGS. 7A through 7G are cross-sectional views of a method of manufacturing the HEMT of FIG. 1, according to example embodiments.

Referring to FIG. 7A, the second channel layer 20 may be disposed on the first channel layer 10. The first channel layer 10 may be a p-type semiconductor layer. For example, the first channel layer 10 may be a p-type doped GaN layer. In this regard, a material of the first channel layer 10 is not limited to GaN, and may include at least one of various materials consisting of InGaN, AlGaN, AlInGaN, etc. Although magnesium (Mg) may be used as a p-type doped material, example embodiments are not limited thereto. Although not shown, the first channel layer 10 may be formed on the substrate (see FIG. 6). The substrate 1 may be formed of, for example, sapphire, Si, SiC, or GaN. The buffer layer 2 may be included in the HEMT to reduce differences between lattice constants and thermal expansion coefficients of the substrate 1 and the first channel layer 10 and limit (and/or prevent) the deterioration of crystallinity of the first channel layer 10. The buffer layer 2 may have a single- or multi-layered structure including at least one material selected from nitride materials including at least one of Al, Ga, In, and B. In particular, the buffer layer 2 may have a single- or multi-layered structure including at least one selected from the group consisting of AlN, GaN, AlGaN, InGaN, AlInN, and AlGaInN.

The n-type semiconductor layer may be used as the second channel layer 20 so that a PN junction may be formed between the first channel layer 10 and the second channel layer 20. For example, the second channel layer 20 may be an undoped GaN layer or an n-type doped GaN layer. In this regard, the undoped GaN layer may be used as the n-type semiconductor layer since a GaN layer exhibits a characteristic of the n-type semiconductor layer when the GaN layer is undoped. Although silicon (Si) may be used as the n-type doping material, example embodiments are not limited thereto.

Figure 7B:
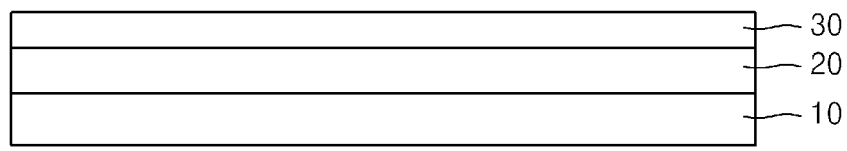

Referring to FIG. 7B, the channel supply layer 30 may be formed on the second channel layer 20. The channel supply layer 30 may be formed of semiconductor that is different from that of the second channel layer 20. An epitaxial growth method may be used to form the channel supply layer 30 on the second channel layer 20. The channel supply layer 30 may be formed of a material (semiconductor) having a polarization characteristic, an energy bandgap, and a lattice constant, at least one of which is different from that of the second channel layer 20. For example, the channel supply layer 30 may be formed of a material (semiconductor) having greater polarizability and/or energy bandgap than those of the second channel layer 20. That is, the channel supply layer 30 may be formed as a single or multi-layered structure including one or more selected from the nitride materials including at least one of Al, Ga, In, and B. For example, the channel supply layer 30 may be formed to have a single or multi-layered structure including at least one selected from the group consisting of AlGaN, AlInN, InGaN, AlN, or AlInGaN. The channel supply layer 30 may be an undoped layer, or may be doped with desired (and/or alternatively predetermined) impurities if necessary.

Figure 7C:
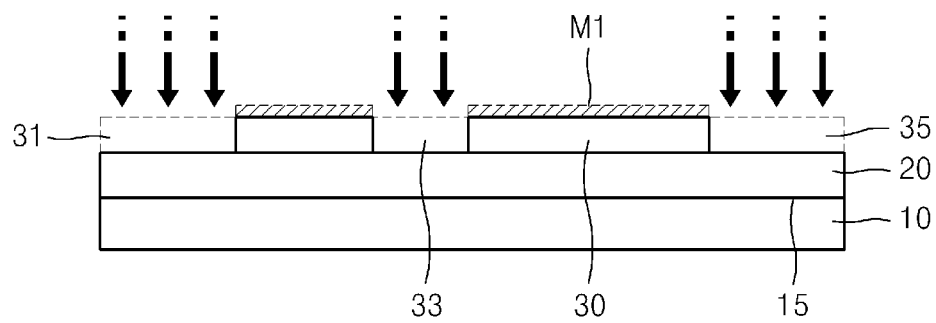
Figure 7D:
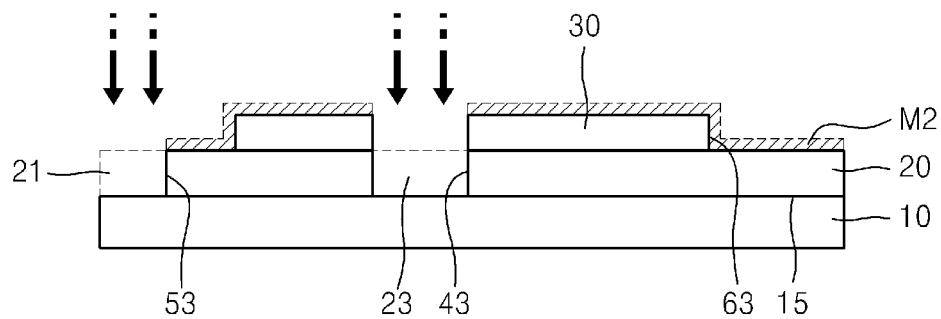

Referring to FIGS. 7C and 7D, the source electrode accommodation portion 53 may be formed over the channel supply layer 30 and the second channel layer 20. The source electrode accommodation portion 53 may be formed as a recess towards the first channel layer 10.

A plurality of etching processes may be used as shown in FIGS. 7C and 7D as an example of forming the source electrode accommodation portion 53. A partial area 31 of the channel supply layer 30 may be removed by using a first mask layer M1 as an etching mask as shown in FIG. 7C. Next, a partial area 21 of the second channel layer 20 may be removed by using a second mask layer M2 as the etching mask as shown in FIG. 7D. The source electrode accommodation portion 53 may be formed over the channel supply layer 30 and the second channel layer 20 through such etching processes. A shape of the source electrode accommodation portion 53 may be different according to pattern shapes of the first mask layer M1 and the second mask layer M2. However, a method of forming the source electrode accommodation portion 53 is not limited to the above example, and may use a method of etching the channel supply layer 30 and the second channel layer 20 by using a single mask layer.

The source electrode accommodation portion 53 may have a depth in such a manner that the source electrode 50 may contact the first channel layer 10. For example, the source electrode accommodation portion 53 may be formed until the interface 15 between the first channel layer 10 and the second channel layer 20. As another example, the source electrode accommodation portion 53' as shown in FIG. 4 may be formed to a deeper depth than the interface 15 between the first channel layer 10 and the second channel layer 20. To this end, the source electrode accommodation portion 53' may be formed over parts of the channel supply layer 30, the second channel layer 20, and the first channel layer 10.

Meanwhile, the gate electrode accommodation portion 43 may be formed in the channel supply layer 30 and the second channel layer 20, and the drain electrode accommodation portion 63 may be formed in the channel supply layer 30 during the process of forming the source electrode accommodation portion 53.

A plurality of etching processes may be used as shown in FIGS. 7C and 7D as an example of forming the gate electrode accommodation portion 43 in the channel layer 30 and the second channel layer 20. A partial area 33 of the channel supply layer 30 may be removed by using the first mask layer M1 as an etching mask as shown in FIG. 7C. Next, a partial area 23 of the second channel layer 20 may be removed by using the second mask layer M2 as the etching mask as shown in FIG. 7D. The gate electrode accommodation portion 43 may be formed over the channel supply layer 30 and the second channel layer 20 through such etching processes. However, a method of forming the gate electrode accommodation portion 43 is not also limited to the above example, and may use a method of etching the channel supply layer 30 and the second channel layer 20 by using a single mask layer.

A partial area 35 of the channel supply layer 30 may be removed by using the first mask layer M1 as an etching mask as shown in FIG. 7C as an example of forming the drain electrode accommodation portion 63 in the channel layer 30. However, a method of forming the drain electrode accommodation portion 63 is not limited to the above example, and may use a method of etching the channel supply layer 30 by using a mask layer different from a mask layer used to form the source electrode accommodation portion 53. Also, the drain electrode accommodation portion 63 is not an indispensable element, and its formation may be excluded if necessary.

Figure 7E:
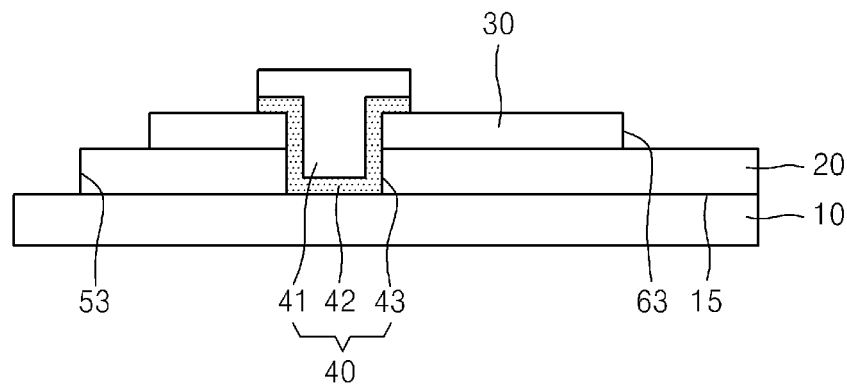

Referring to FIG. 7E, the gate electrode 41 may be formed in the gate electrode accommodation portion 43. In this regard, the insulating layer 42 may be disposed between the gate electrode 41 and the gate electrode accommodation portion 43. The gate electrode 41 may be located closer to the source electrode 50 than to the drain electrode 60. That is, a distance between the source electrode 50 and the gate electrode 41 may be shorter than a distance between the drain electrode 60 and the gate electrode 41. However, example embodiments are not limited thereto, and relative distances between the source electrode 50 and the drain electrode 60 and the gate electrode 41 may vary.

Figure 7F:
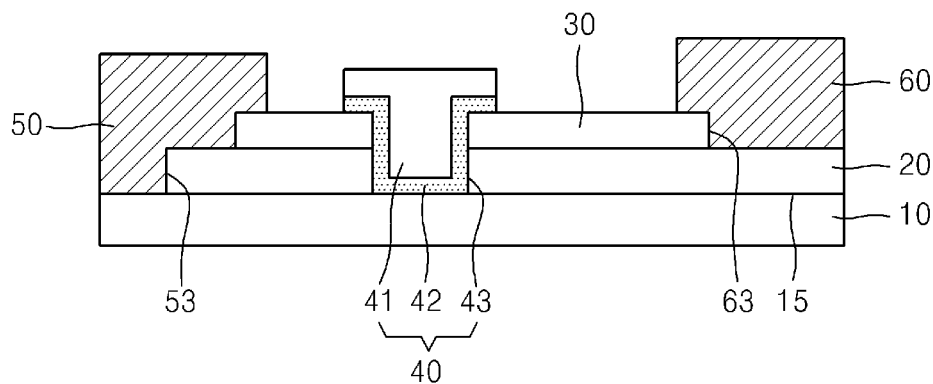

Referring to FIG. 7F, the source electrode 50 is formed in the source electrode accommodation portion 53 so that the source electrode 50 may contact the first channel layer 10. Meanwhile, the drain electrode 60 is formed in the drain electrode accommodation portion 63 that is spaced apart from the first channel layer 10 so that the drain electrode 60 may be spaced apart from the first channel layer 10.

Figure 7G:
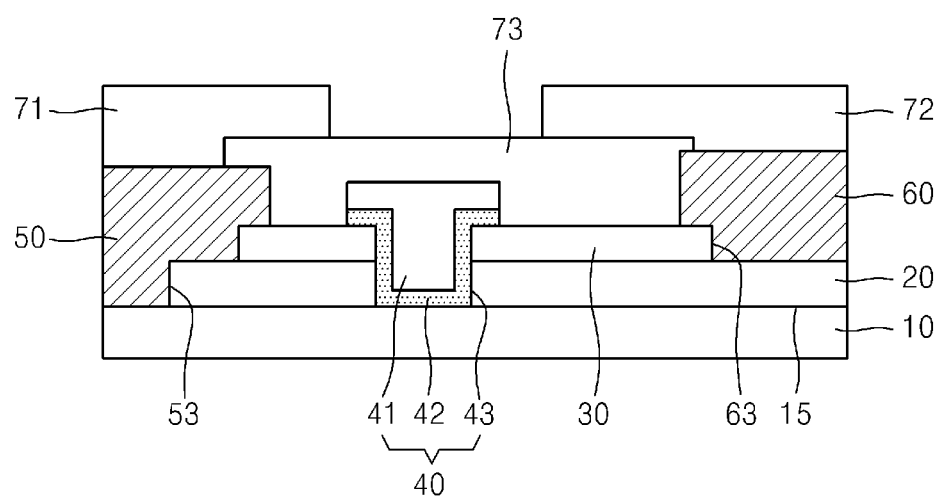

Referring to FIG. 7G, the passivation layer 73 may be disposed between the source electrode 50 and the drain electrode 60. The passivation layer 73 may insulate the gate electrode 41 from the source electrode 50 and the drain electrode 60. Also, the first pad 71 may be formed contacting the source electrode 50. The second pad 72 may be formed contacting the drain electrode 60.

FIGS. 8A through 8H are cross-sectional views of a method of manufacturing the HEMT of FIG. 5, according to example embodiments. FIGS. 8A through 8H show an example of a method of forming the source electrode 50, and a redundant description between FIGS. 8A through 8H and FIGS. 7A through 7G will not be repeated here.

In example embodiments, the source electrode 50 may include a plurality of areas having different ohmic contacts. For example, the source electrode 50' may include the first area 50a and the second area 50b.

Figure 8A:
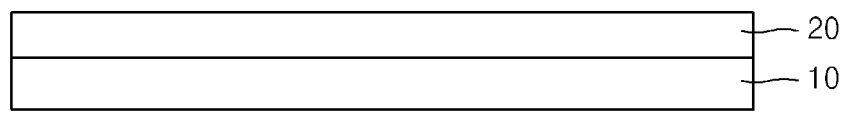
FIGS. 8A through 8H are cross-sectional views of a method of manufacturing the HEMT of FIG. 5, according to example embodiments.
Figure 8B:
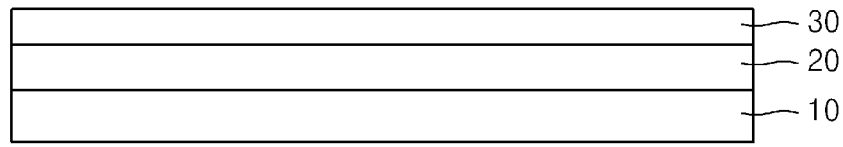
Figure 8C:
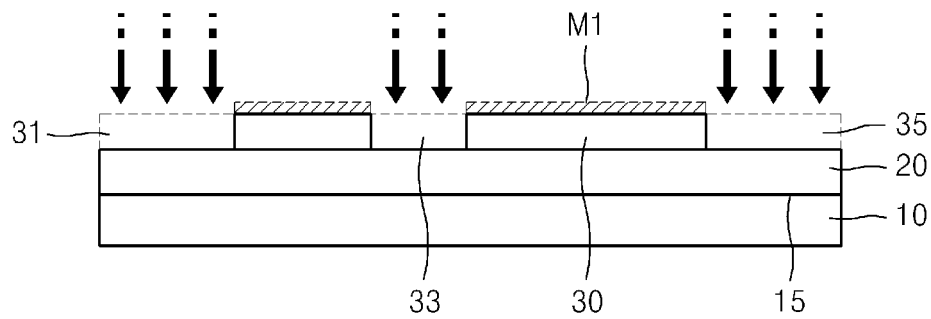
Figure 8D:
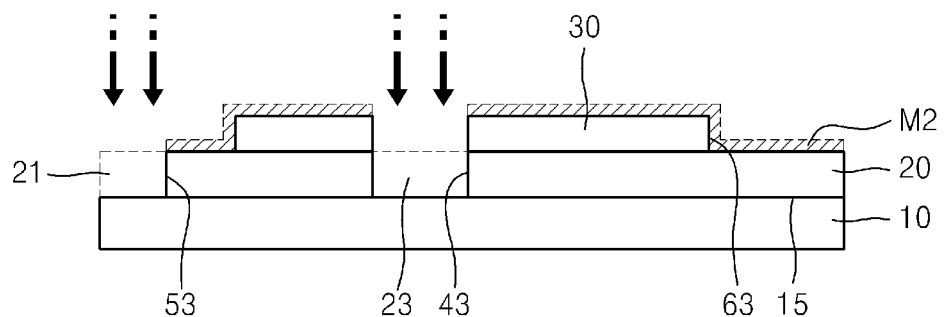
Figure 8E:
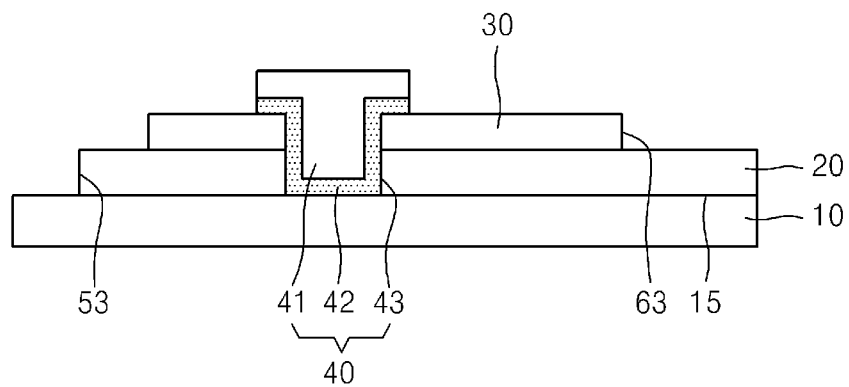
Figure 8F:
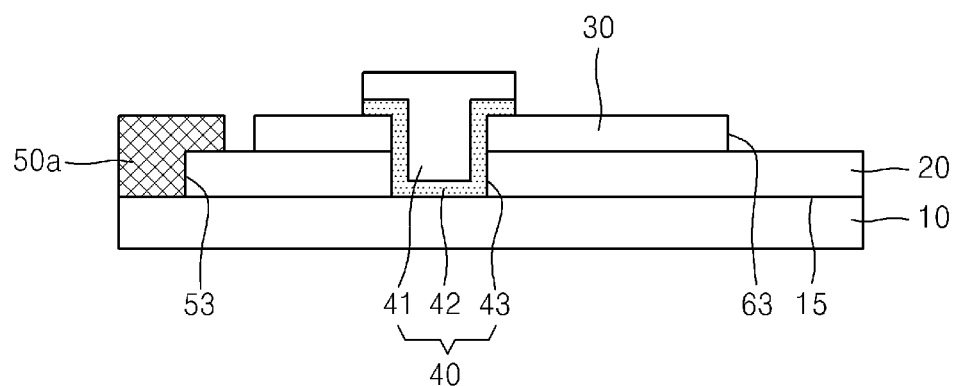

Referring to FIG. 8F, the first area 50a may be formed in the source electrode accommodation portion 53 to contact the first channel layer 10. The first area 50a may be in p-type ohmic contact with the first channel layer 10 that is a p-type semiconductor layer.

Figure 8G:
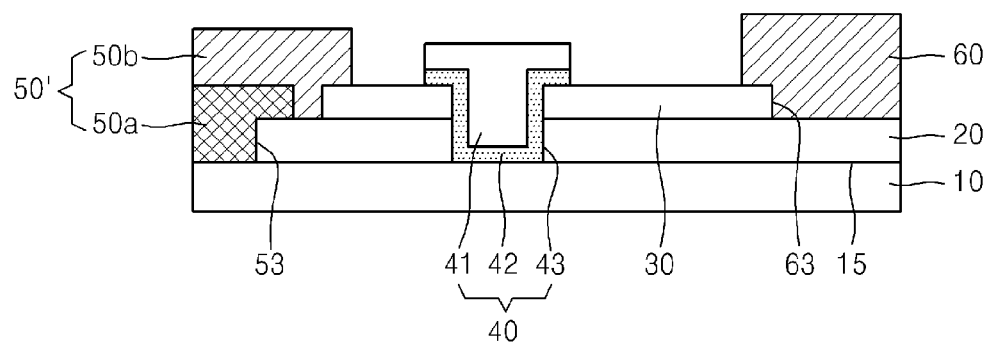
Figure 8H:
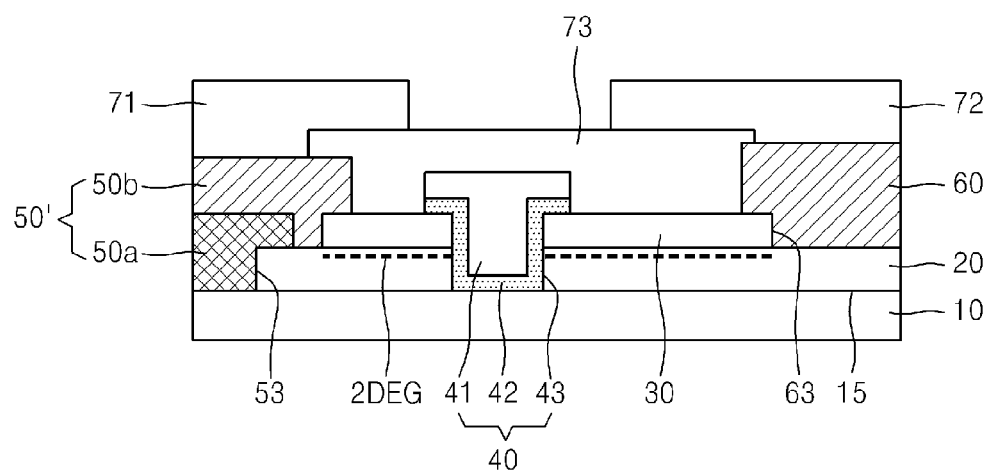

Referring to FIG. 8G, the second area 50b may be formed in the source electrode accommodation portion 53 to contact at least one of the second channel layer 20 and the channel supply layer 30. The second area 50b may be in n-type ohmic contact with the second channel layer 20 that is an n-type semiconductor layer. Also, the channel supply layer 30 may be the n-type semiconductor layer. The second area 50b of the source electrode 50' may be in n-type ohmic contact with the channel supply layer 30.

In this regard, the first area 50a and the second area 50b of the source electrode 53' are not necessarily formed of different materials. The area 50a and the second area 50b may be formed of the same material capable of forming p-type ohmic contact and n-type ohmic contact. In this case, the source electrode 50 may be formed through a single process.

The methods of FIGS. 8A through 8H and FIGS. 7A through 7G may be variously modified. For example, although the source electrode accommodation portion 53 and the gate electrode accommodation portion 43 may be etched through the same process, in a case where the gate electrode accommodation portion 43 is not formed or an etching depth of the gate electrode accommodation portion 43 is different from that of the source electrode accommodation portion 53, an etching process using different masks may be used. Meanwhile, although the source electrode accommodation portion 53 and the gate electrode accommodation portion 43 may be etched through a plurality of etching processes, in a case where the drain electrode accommodation portion 63 is not formed, the source electrode accommodation portion 53 and the gate electrode accommodation portion 43 may be etched through a single etching process.

As another example, a method of manufacturing the HEMT of FIG. 3 according to example embodiments may include processes in the methods of FIGS. 7A to 7G and 8A to 8H. However, instead of performing an etching process for forming the gate electrode accommodation portion 43 and a process for forming the insulating layer 42, a process of forming the channel depletion layer 45 may be performed before the gate electrode 41 is formed. As another example, an oxidized area may be formed instead of forming the insulating layer 42.

Although a HEMT according to example embodiments may be used as, for example, a power device, example embodiments are not limited thereto. A HEMT according to example embodiments may be used in various applications.

As described above, according to example embodiments, a single HEMT may perform functions of a field effect semiconductor device and a FRD, thereby reducing time and cost taken to manufacture and connect an additional FRD, and limiting (and/or preventing) an avalanche breakdown from occurring when the single HEMT is turned off.

It should be understood that example embodiments described herein should be considered in a descriptive sense only and not for purposes of limitation. For example, the structures of HEMTs according to example embodiments in the drawings may be variously changed. In addition, the manufacturing method of FIGS. 7A through 7G may be variously modified. Moreover, those of ordinary skill in the art would under that a HEMT according to example embodiments may also be used in other semiconductor devices.

While some example embodiments have been particularly shown and described, it will be understood by one of ordinary skill in the art that variations in form and detail may be made therein without departing from the spirit and scope of the claims.

What is claimed is:

1. A high electron mobility transistor comprising:
a first channel layer;
a second channel layer on the first channel layer, the second channel layer forming a PN junction with the first channel layer;
a channel supply layer on the second channel layer;
a drain electrode spaced apart from the first channel layer, the drain electrode contacting at least one of the second channel layer and the channel supply layer;
a source electrode contacting the first channel layer and contacting at least one of the second channel layer and the channel supply layer; and
a gate electrode unit between the source electrode and the drain electrode,
the gate electrode unit having a normally-off structure.

2. The high electron mobility transistor of claim 1, wherein the first channel layer is a p-type semiconductor layer, and the second channel layer is an n-type semiconductor layer.

3. The high electron mobility transistor of claim 2, wherein the first channel layer is a p-type doped GaN layer.

4. The high electron mobility transistor of claim 2, wherein the second channel layer is one of an undoped GaN layer and an n-type doped GaN layer.

5. The high electron mobility transistor of claim 1, wherein
at least one of the channel supply layer and the second channel layer defines a source electrode accommodation portion, and
the source electrode is in the source electrode accommodation portion.

6. The high electron mobility transistor of claim 5, wherein the source electrode accommodation portion is a recessed towards the first channel layer.

7. The high electron mobility transistor of claim 6, wherein the source electrode accommodation portion extends to one of:
an interface between the first channel layer and the second channel layer, and
a deeper depth than the interface between the first channel layer and the second channel layer.

8. The high electron mobility transistor of claim 1, wherein source electrode includes:
a first area of the source electrode that is in ohmic contact with the first channel layer; and
a second area of the source electrode that is in ohmic contact with at least one of the second channel layer and the channel supply layer.

9. The high electron mobility transistor of claim 8, wherein
the first area of the source electrode is in p-type ohmic contact with the first channel layer, and
the second area of the source electrode is in n-type ohmic contact with at least one of the second channel layer and the channel supply layer.

10. The high electron mobility transistor of claim 1, wherein a bandgap of the channel supply layer is greater than a bandgap of the second channel layer.

11. The high electron mobility transistor of claim 1, wherein
the gate electrode unit includes,
a gate electrode between the source electrode and the drain electrode, and
a gate electrode accommodation portion defined by the channel supply layer and the second channel layer; and
the gate electrode is in the gate electrode accommodation portion.

12. The high electron mobility transistor of claim 11, wherein
the gate electrode accommodation portion is a recessed towards the first channel layer.

13. The high electron mobility transistor of claim 12, further comprising:
an insulating layer between the gate electrode and the gate electrode accommodation portion.

14. The high electron mobility transistor of claim 1, wherein the gate electrode unit includes:
a gate electrode between the source electrode and the drain electrode; and
a channel depletion layer between the gate electrode and the channel supply layer.

15. The high electron mobility transistor of claim 14, wherein the channel depletion layer includes a p-type semiconductor layer.

16. A method of manufacturing a high electron mobility transistor, the method comprising:
forming a first channel layer;
forming a second channel layer on the first channel layer, the first channel layer and the second channel layer forming a PN junction with each other;
forming a channel supply layer on the second channel layer;
forming a source electrode accommodation portion defined by the second channel layer and the channel supply layer,
the source electrode accommodation portion exposing a part of the first channel layer;
forming a source electrode in the source electrode accommodation portion,
the source electrode contacting the first channel layer;
forming a drain electrode that is spaced apart from the first channel layer and contacts at least one of the second channel layer and the channel supply layer; and
forming a gate electrode unit between the source electrode and the drain electrode,
the gate electrode unit having a normally-off structure.

17. The method of claim 16, wherein the forming the source electrode accommodation portion includes forming the source electrode accommodation portion to one of:
an interface between the first channel layer and the second channel layer, and
a deeper depth than the interface between the first channel layer and the second channel layer.

18. The method of claim 16, wherein the forming the source electrode includes:
forming a first area of the source electrode that is in ohmic contact with the first channel layer; and
forming a second area of the source electrode that is in ohmic contact with at least one of the second channel layer and the channel supply layer.

19. The method of claim 16, wherein the forming the gate electrode unit includes:
forming a gate electrode accommodation portion as a recess defined the channel supply layer and the second channel layer that is between the source electrode and the drain electrode; and
forming a gate electrode in the gate electrode accommodation portion.

20. The method of claim 19, further comprising:
  forming an insulating layer on the gate electrode accommodation portion before the forming the gate electrode.

21. The method of claim 16, wherein the forming the gate electrode unit includes:
  forming a channel depletion layer between the source electrode and the drain electrode; and
  forming the gate electrode on the channel depletion layer.

* * * * *